(12) United States Patent  (10) Patent No.: US 6,587,389 B2
De Paor et al.  (45) Date of Patent: Jul. 1, 2003

(54) DRAM REFRESH COMMAND OPERATION

(75) Inventors: Denise De Paor, Carraroe (IE); Tadhg Creedon, Furbo (IE)

(73) Assignee: 3Com Corporation, Santa Clara, CA (US)

( * ) Notice: Subject to any disclaimer, the term of this patent is extended or adjusted under 35 U.S.C. 154(b) by 0 days.

(21) Appl. No.: 09/984,626

(22) Filed: Oct. 30, 2001

(65) Prior Publication Data

US 2003/0081483 A1 May 1, 2003

(30) Foreign Application Priority Data

Sep. 19, 2001 (GB) .............................................. 0122568

(51) Int. Cl.[7] .............................................. G11C 7/00
(52) U.S. Cl. ................... 365/222; 365/230.03; 365/233
(58) Field of Search ............................. 365/222, 230.03, 365/233

(56) References Cited

U.S. PATENT DOCUMENTS

| | | | |
|---|---|---|---|
| 4,706,221 A | 11/1987 | Satoh e tal. | |
| 4,725,987 A | 2/1988 | Cates | |
| 5,511,033 A | 4/1996 | Jung | |
| 6,310,814 B1 | * 10/2001 | Hampel et al. | ............. 365/233 |
| 6,438,055 B1 | * 8/2002 | Taguchi et al. | ............. 365/222 |

* cited by examiner

Primary Examiner—Huan Hoang
(74) Attorney, Agent, or Firm—Nixon & Vanderhye P.C.

(57) ABSTRACT

A method and apparatus for refresh command operations on an SDRAM that avoids use of refresh commands requiring all banks of the SDRAM to be idle.

Burst operation establishes command sequences that include Nop command intervals. Some of these Nop intervals are used to perform operations on a bank other than the one under access for the burst that provide a refresh. ACTIVE followed by PRECHARGE commands are inserted into the command intervals addressed to a refresh address. The refresh addresses are generated externally of the SDRAM and provided to a multiplexer that sequences them with the data addresses. A secondary timer checks that required refresh has occurred and prioritizes the refresh addresses over data addresses in the multiplexer in the event that a refresh has not been completed shortly before a maximum refresh interval.

14 Claims, 4 Drawing Sheets

DRAM REFRESH COMMAND OPERATION

This invention relates to command operation of DRAMs, which avoids use of refresh commands requiring routine cessation of read and write accesses.

BACKGROUND OF THE INVENTION

Synchronous DRAM chips, that is having a synchronous interface with all signals registered on a common (say positive) edge of a clock signal, are usually organized internally into several banks, typically four, and capable of operating in burst mode. Command codes entered on command inputs determine the type of operation and address inputs determine the bank as well as the row and column to which the command is directed.

Arranging the memory into banks enables more efficient access as it enables one bank to be prepared for an access while another is undergoing access.

It is also more efficient to operate DRAMs in burst mode where several locations are accessed in sequence for a single read or write command. With many applications such as data communications or video processing where large blocks of sequential data are moved in and out of memory, bursts of 8 or more clock cycles may be used which means that operation on one bank will take place for those cycles before another bank is accessed. Further, the same bank may be repeatedly accessed.

As with all DRAM chips it is necessary to refresh the memory cells which is usually done on a row by row basis in a cyclic manner under the control of a timer that keeps track of when refresh is due. A 128 Mb SDRAM configured as a quad-bank DRAM typically has 134,217,728 cells (or bits), each bank having 33,554,432 bits organized as 4,096 rows by 256 columns by 32 bits. Typically each of the 4096 rows of each bank must be refreshed every 64 ms, which is done either by doing a burst of 4096 refresh operations to each bank every 64 ms or, if refresh is performed in a distributed manner, a refresh command to a different row in each bank every 15.625 $\mu$s.

With these multi-bank SDRAM chips, refresh operation is conducted simultaneously on all banks during which time no data operations are carried out. Before the refresh can begin all the rows that were open for data operations have to be closed, by way of a PRECHARGE. The open rows may be in more than one bank as there may be read/write access underway in one bank and a second bank opened ready for the subsequent access. A third bank (used for the previous access) may already be in the process of being closed by a previous PRECHARGE instruction.

When the timer indicates refresh is due, data operations must be completed or interrupted. The internal control could provide for either. However, in particular when operating on long bursts it may not be possible to complete the burst without over-running the refresh due time and so interruption is necessary. To avoid complexity in the controller the refresh required indication from the timer is set to precharge (close) all open banks, resulting in some loss of current data operations.

Closing all the banks to data operations for the duration of the refresh results in loss of bandwidth. The time that the SDRAM is unavailable is the sum of the time taken to close (precharge) the open banks, plus the refresh time, plus the time to open them again.

It is desirable to be able to refresh without suspending data operations.

Techniques for hiding refresh operations have been proposed in less complex systems that do not have multi-bank interleaving. These proposals have required either additional hardware to carry separate lines for refresh commands or software modification that consumed CPU bandwidth.

SUMMARY OF THE INVENTION

The present invention is based on the surprising realization that despite the complexity of interleaved multi-bank data access operations, burst operation enables most if not all the refresh operations to be simultaneously interleaved (i.e. run in parallel) with continuing data operations.

According to the invention there is provided a method of refreshing an SDRAM chip having a memory internally configured in a plurality of banks, the method comprising: issuing data operation commands in burst mode whereby at least some command intervals are available for other operation commands, issuing in one of said available command intervals a command to open a row in a bank other than the bank under access in the current burst, after a predetermined interval and before said bank other than the bank under access is required for a data operation, issuing in another of said available command intervals a command to close the opened row. The closing of the row is usually accomplished by closing the bank.

The invention also provides apparatus for generating commands for refreshing an SDRAM that is internally configured in a plurality of banks and operates in burst sequences, the apparatus comprising: an address generator for establishing refresh addresses of row and bank due for refresh; a multiplexer for sequencing the refresh addresses with data addresses so that the refresh address is sequenced to a bank that will not be accessed for a data burst, a controller for inserting into burst command intervals an open command to the refresh address and after a predetermined minimum interval inserting into burst command intervals a close command to the refresh address, and in which the open and close operations are arranged to be completed before the bank of the refresh address is next addressed by a data access command.

The present invention utilises standard SDRAM layout and data and command buses, but does not utilise the usual system refresh commands. Instead of refresh commands a command such as the commonly termed "active" command which would normally be used to open a row ready for a data operation is used, followed by a command such as the commonly termed "precharge" command to close the row again without any data operation being performed. This utilises existing command operations and command and address buses to one of the banks not undergoing data operations and can be run in parallel with data access operations and their attendant interleaved operations on other banks.

BRIEF DESCRIPTION OF THE DRAWINGS

The invention is now described by way of example with reference to the accompanying drawings in which.

DETAILED DESCRIPTION OF THE INVENTION

Figure 1:
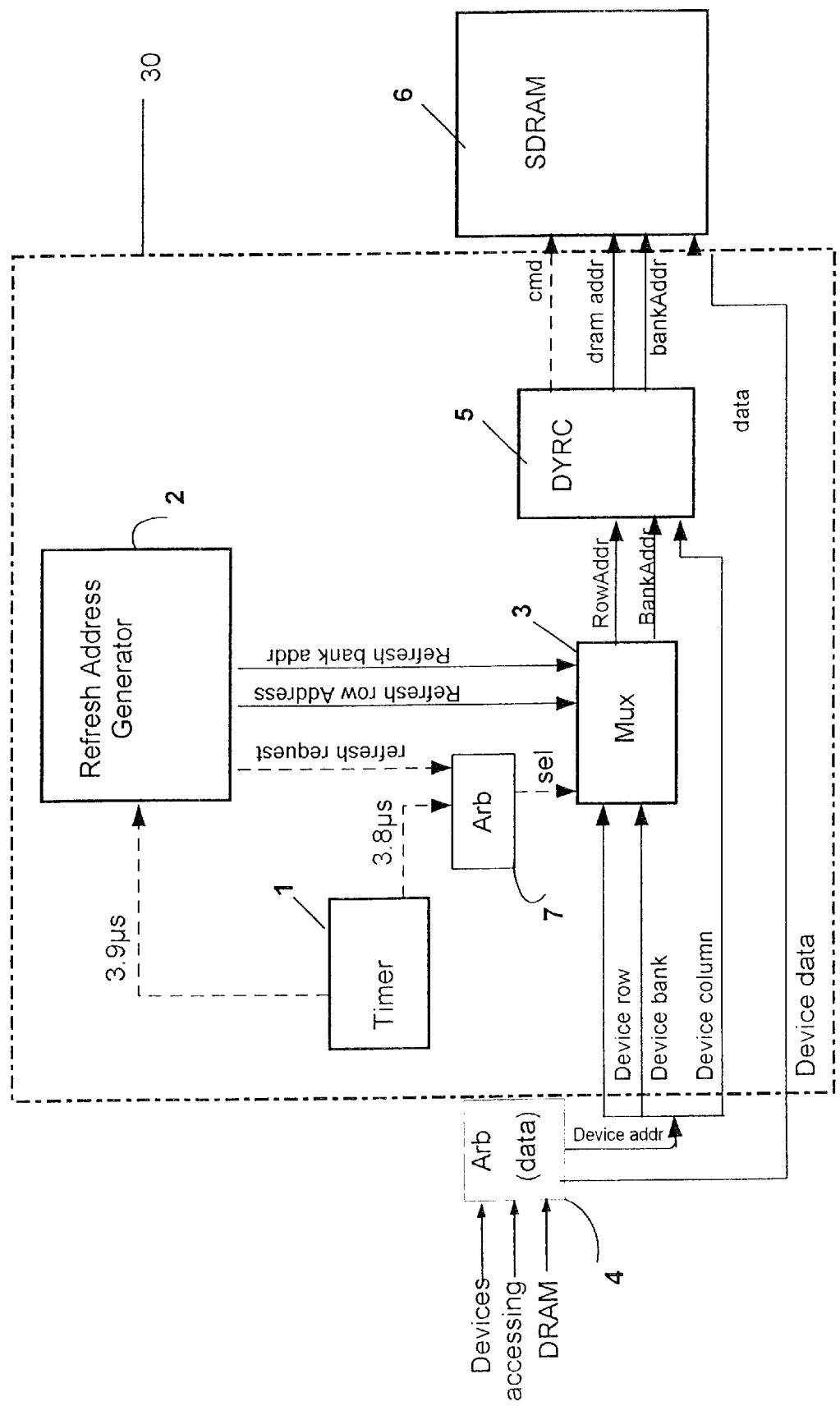
FIG. 1 is a schematic block diagram illustrating the command control system of the invention.

A typical state of the art SDRAM of the type operated in the invention is a Micron 48LC4M32B-2, and will have the following input controls or signals which in combination govern the timing and functions. Other SDRAMs will have equivalent controls or signals.

CLK is the clock and will be driven by the system clock.

CKE is the clock enable signal and can be switched to activate or deactivate the CLK signal CS# is chip select and enables/disables the command decoder.

WE#, CAS#, RAS# are command inputs which define the command (when CS# in enable state).

DQM0-DQM3 are Input/Output Mask.

BA0, BA1 are Bank Address Inputs that define to which bank a command is destined.

A0–A11 are Address Inputs to select row and column addresses of the array within a bank.

DQ0–DQ31 are data buses for input and output.

Additionally there will be power and ground supply connections.

Depending upon the settings of the controls the following commands are issued.

COMMAND INHIBIT; NO OPERATION (NOP); LOAD MODE REGISTER; ACTIVE, READ; WRITE; PRECHARGE; AUTO PRECHARGE; BURST TERMINATE, AUTO REFRESH and SELF REFRESH.

Before any READ or WRITE commands can be executed by a bank, the relevant row in that bank must be opened by way of the ACTIVE command, so the ACTIVE command is issued prior to READ or WRITE. Also a subsequent ACTIVE command to a different row in the same bank can only be issued if the previously accessed row has been closed by way of the PRECHARGE or AUTO PRECHARGE command.

An ACTIVE command can be issued to a different bank from that which is undergoing data operations in preparation for a subsequent data operation and by overlapping the preparation for next access to a different bank an overall reduction in row-access time is achieved. Likewise a PRECHARGE or AUTO PRECHARGE instigated at the end of access to a row may also interleave with operations on other banks. It is generally preferred to operate using AUTO PRECHARGE because this can be implemented in the background.

Commands are conveyed to the banks via command lines that communicate with each bank. Addresses for access are conveyed via an address bus. Under current convention, for a READ or WRITE the address value transmitted at the same time as the ACTIVE command indicates the row address and the address value transmitted at the same time as the READ or WRITE command indicates the column address. Address input A10 is also used at other times to set AUTO PRECHARGE. A separate line is used to select the bank and this is transmitted at the same time as the ACTIVE and row address commands, and also on the READ or WRITE command.

In normal operation multiple sources will be performing data access operations to the SDRAM and under the control of a data arbitration unit the accesses move from bank to bank with ACTIVE and PRECHARGE or AUTO PRECHARGE overlap as described above.

In the established command structure, to avoid clashes with data operations the refresh cycle is only issued when all banks are idle and the counter/timers apply the refresh address cycle similarly to each bank. To achieve this condition at the required refresh time all operations on all the banks are completed (or if need be interrupted), the banks closed via one of the precharge commands (in this instance normally a PRECHARGE to all banks), a refresh operation performed and then the normal data cycles started-up again. With long burst operation, it may transpire that the READ or WRITE in the middle of a burst may be the operation that has to be completed (i.e. the burst can not be completed) and also there is loss of bandwidth due to keeping all banks idle for the precharge plus refresh time. This disturbance happens in a typical state of the art SDRAM either every 64 ms if a burst refresh is to refresh the entire array of each bank, or every 15.625 $\mu$s if a given row in each bank is refreshed.

As previously mentioned, it is now usual for data operations on SDRAMs to be in burst mode. Typically an SDRAM is programmable to accept different burst lengths, including burst lengths that continue until interrupted by another command. This programming is usually part of the initial set-up procedure. Also a bank may be repeatedly accessed. This results in one bank being accessed for an extended period, and even though ACTIVE and PRECHARGE commands may be interleaved there will be NOP command intervals during some bursts. In the invention some of these NOP intervals are used to perform operations on a non accessed bank that provide a refresh so that it no longer becomes necessary to put all banks on idle and use the REFRESH command.

In command terms, instead of REFRESH, a row is provided with an ACTIVE command, even though it is not in line for a data access. Then after a minimum active period the row is closed with a PRECHARGE command. Another row is then issued with the ACTIVE/PRECHARGE commands. Depending on the duration of data access to a given bank and the chosen refresh address selection routine the next row selected for refresh may be in another bank or the same bank. As is explained later, longer data access to a given bank enables refreshes on more than one row in another bank but with shorter data accesses cycling from bank to bank for each refresh is needed. The ACTIVE/PRECHARGE modified refresh commands are carried by the usual existing address and command buses while the data access procedures to another bank continues undisturbed.

Time and address generators are used to cycle the addresses for each bank. However, in the preferred implementation instead of providing a row REFRESH to a row in each of the four banks every 15.625 $\mu$s or a burst REFRESH every 64 ms, the ACTIVE/PRECHARGE is phased over the four banks so that one row in one bank is accessed every 3.9 $\mu$s. This will, in most instances, not result in a conflict with data access, although various additional techniques for handling and minimizing conflicts may be included in the arbitration/multiplexing and also burst mode selection.

Referring now more specifically to an exemplary implementation, FIG. 1 shows a system diagram for incorporating the modified commands in accordance with the invention. In most implementations the majority of the functions will be carried out within a memory controller, shown generally by the dotted box 30 which represents at least a part of the memory controller.

The system includes a timer 1 which lets the system know when a refresh interval has passed. In the exemplified SDRAM, timer 1 provides a timing signal every 3.9 $\mu$s to a refresh address generator 2 which then provides the address of the bank and row that require refreshing and is incremented to the next address. The refresh address generator will usually be a state machine.

In the implementation illustrated a single refresh address generator operates over all (four in the example) banks but it would be possible in other implementations to have an address generator for each bank allowing the possibility of fewer conflicts in banks not used as regularly for data operations as others.

The output bank and row addresses of the refresh address generator are provided to a system multiplexer 3 which also receives addresses for data operations from a data arbitration unit 4 in this example provided outside the memory controller and receiving inputs from the devices accessing the SDRAM.

The data arbitration unit 4 operates in any customary manner and establishes the order of data accesses. These may be entirely random with regard to the addressed bank, but it is usual to order the bank accesses in a cyclic manner which is possible as normally there will be multiple sources reading and writing to memory. Within this implementation it is assumed the data accesses cycle around banks 0, 1, 2, 3 and back to 0. The data arbitration unit also organises repeated read or write bursts within the same row, to coordinate with data transmission packages.

Within the multiplexer the addresses are sequenced with the data access addresses and refresh addresses sent out in accordance with control parameters that ensure they do not conflict.

Addresses from the multiplexer are input to the dynamic ram control (DYRC) 5 which sends out the control commands to the SDRAM 6.

The sequence of operation is described in more detail below with reference to the timing diagram of FIG. 2.

It is assumed in this example that the burst length is 2 (that is 2×4 bytes), and that up to 4 repeated accesses to a bank/row are permitted. Therefore the output commands from the DYRC 5, illustrated on the line referenced 10, are a basic sequence of (as shown) writes in alternate slots. The intervening slots are then either NOP when there is no function being implemented or another interleaved command. After 8 command slots (4 bursts) the next command sequence will be to a different bank, as determined by the data arbitration unit 4.

Figure 2:
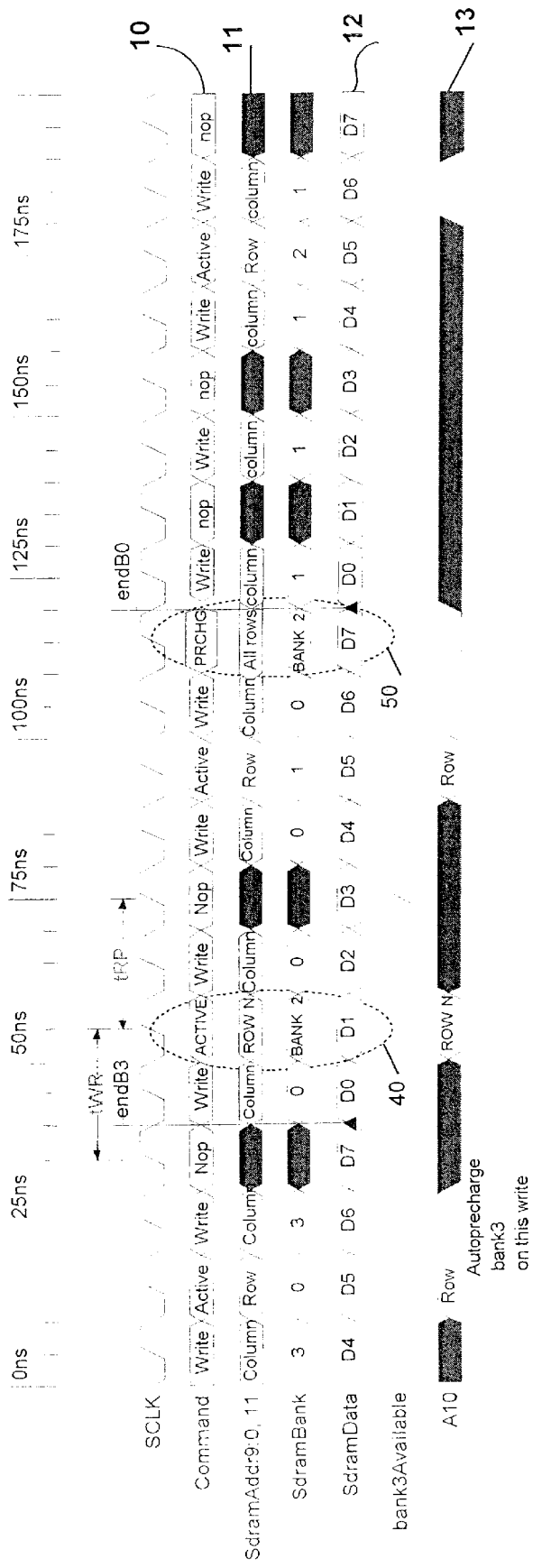
FIG. 2 is a timing diagram illustrating the sequence of commands in an exemplary realization utilizing repeated burst lengths of 2.

Starting at the left of FIG. 2 the first command is "write" addressed to bank 3 (This is shown by the Sdram Bank line referenced 11). The second command is "Active" addressed to bank 0 and is preparing the addressed row of bank 0 for data access while the second write of the burst to bank 3 takes place. The third and fourth commands are "write" and "Nop" of another burst to bank 3 and then the first "write" to bank 0 occurs. Three further "writes" to bank 0 take place and it will be seen that between the third and fourth "write" to bank 3 an "Active" to bank 1 in preparation for subsequent data operations is interleaved.

In addition to the overlap of the "active" commands relating to the next data operation it will be observed within outlined box 40 that after the first "write" to bank 0 an "ACTIVE" (shown in capitals) is addressed to Bank 2 and within outlined box 50 after the fourth "write" a PRECHARGE (shown as PRCHG) is addressed to Bank 2. These commands provide the modified refresh to the relevant row of Bank 0.

Although not shown, during the next set of commands while writes to Bank 1 are taking place an ACTIVE/ PRECHARGE refresh to Bank 3 could be inserted. However, as an ACTIVE/PRECHARGE refresh is only required every 3.9 μs they do not need to be inserted into each set of commands. Indeed, because of this it is possible, in most circumstances, to avoid conflict between data operations and the need to refresh a row in the same bank. The multiplexer may be set in various ways to insert the refresh addresses at the appropriate time, likewise depending on other settings such as burst length the DYRC may insert the commands at other given intervals.

When the banks are being accessed in sequence 0, 1, 2, 3, the ACTIVE/PRECHARGE refresh is set in this implementation to be addressed to bank N+2 when data operations are on bank N. Looking at FIG. 2 it will be appreciated that while bank 0 is being written to, bank 3 having just finished being accessed will be under a post-access precharge (usually AUTO PRECHARGE) and bank 1 is the next bank to be opened for data access. Thus avoiding bank N−1 and N+1 avoids conflict and, for a four bank device this means refreshing bank N+2. In the event that the banks are randomly accessed the various controls will have to establish the bank availability by checking a record of the last and next banks scheduled for access. This information is available, for example, from the data arbitration unit.

The Active period of the modified refresh in this typical exemplary device needs to be maintained for a mininum of 49 nanoseconds, implemented here as five 10 nanosecond clock cycles. Two clock cycles are required from the PRECHARGE until the bank would be available for activation for data or other purposes.

Rows 12 and 13 of the timing diagram show respectively the availability of bank 3 and the A10 signals. A10 is used to carry part of the row address, but at other times signifies other things. Bank 3 which is accessed in the first set of commands is set for auto precharge on the last write by A10 being high at the same time as a Write command to it. This auto precharge signal can also be seen on the last write to the banks 0 and 1. When the specific PRECHARGE command is used, if A10 is low, as shown in FIG. 2, a single bank is precharged. (If A10 is set high with PRECHARGE all banks are precharged).

Returning to FIG. 1 it will be seen that there is a second output from timer 1 to a refresh arbitration block 7, and arbitration block 7 also inputs to multiplexer 3. This provides a secondary timing function ensuring that refresh has been carried out before the end of the refresh interval. As illustrated, the secondary timing function provides this check at 3.8 μs (that is a short time before the end of the refresh interval) and if the addressed row has not been refreshed will cause the multiplexer to allocate priority to the ACTIVE/PRECHARGE refresh, suppressing data access. This situation would be rare, but may occur from time to time if one bank is accessed for a very extended period, or when bank access is randomized.

Figure 3:
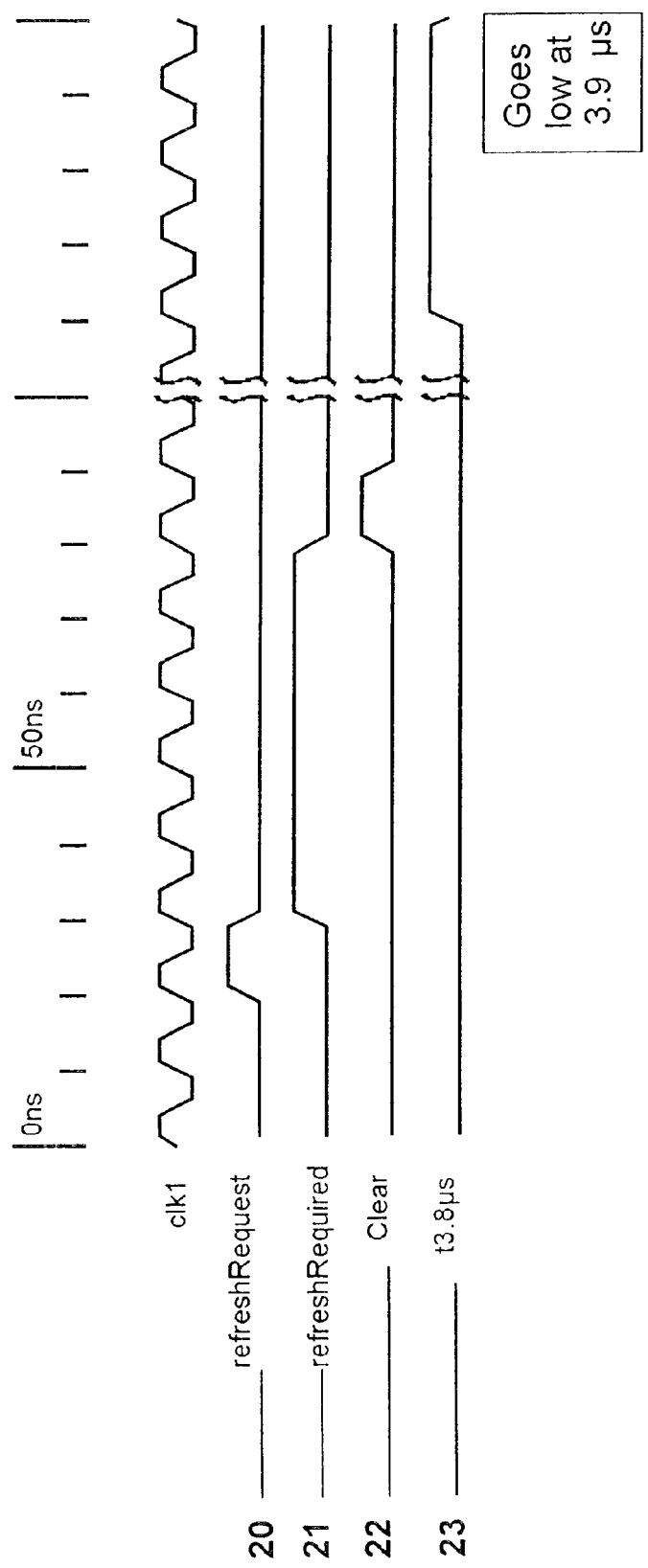
FIG. 3 is a schematic diagram illustrating interaction of the command sequence signals and a secondary timer.

FIG. 3 is a timing diagram of refresh and secondary timer intervals. Timer 1 sends out the refresh interval signal to the refresh address generator 2. The address generator, as previously indicated, sends the next bank/row refresh address and increments the row address every time and (in this example) the bank address every fourth signal. Additionally the refresh address generator issues a "refreshRequest" command to the arbitration block 7, represented by row 20 in FIG. 3. An internal "refreshRequired" signal in the arbitration block (shown by row 21) latches on to the refreshRequest signal and is cleared when the precharge command of the ACTIVE/PRECHARGE sequence has been issued.

Timing line 23 of FIG. 3 is the secondary timer which is shown low for 3.8 μs, then at the end of that period goes high and checks the latched "refreshrequired" signal. If the "refreshRequired" signal is low then the refresh has been carried out and no intervention is required and the secondary timer signal reverts to low at 3.9 μs for the next address. However if the latched "refreshRequired" is still high the refresh has not taken place and the arbitration block intervenes to send a priority signal to multiplexer 3 and hence onward to DYRC 5 to give priority to the (modified) refresh over the data operations.

The particular timing intervals required for refresh and selected for the secondary timer and other response times are given here in exemplary manner for a state of the art SDRAM, but may of course vary depending on specific implementations such as structure and clock timing.

FIG. 2 illustrated burst access with repeated access to the same row with operation on a given bank occupying eight command intervals. A longer sequence of accesses could be used, as could a longer burst. By way of example of this, FIG. 4 illustrates a similar sequence except that the SDRAM has been set up to operate with single bursts of eight to each bank replacing the 4 bursts of two.

Figure 4:
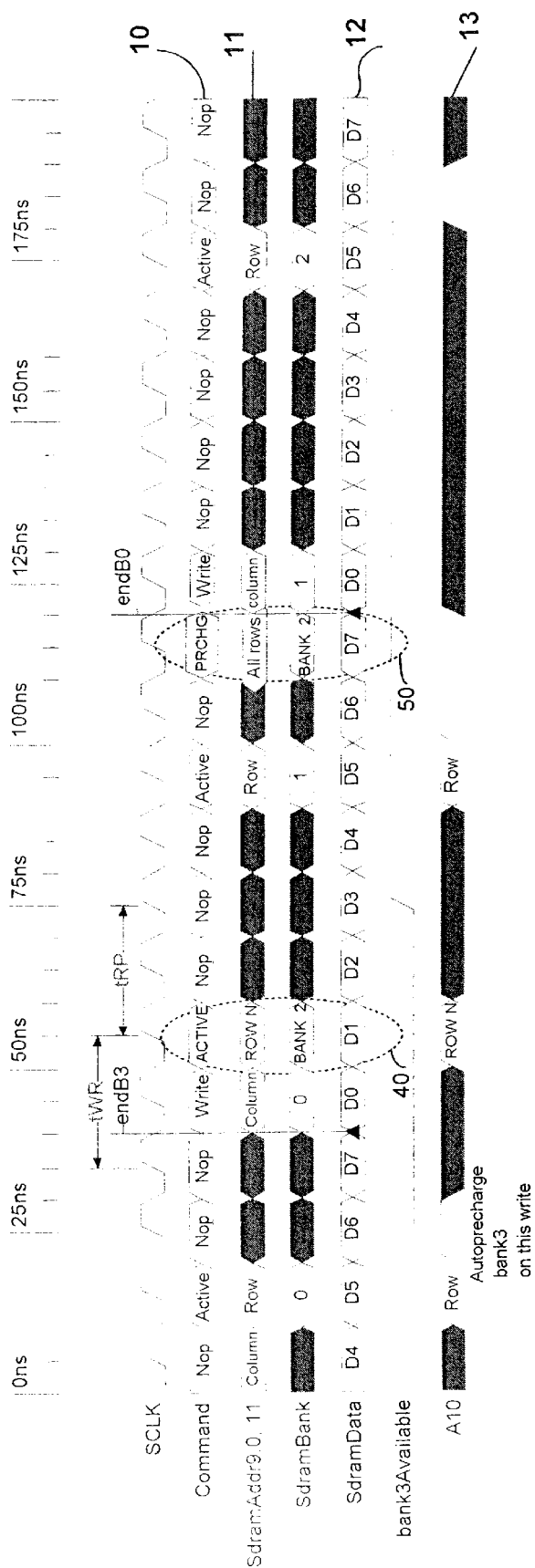
FIG. 4 is a timing diagram illustrating the sequence of commands in an exemplary realisation using a burst length of 8.

In both FIGS. 2 and 4, the refresh Active and Precharge commands are completed during data operation on one bank (bank 0). It is possible for the Active and Precharge to be issued during access to different banks providing that there is sufficient time from the closing refresh precharge to when the refreshed bank needs to be activated for a data operation.

In the illustrated implementation two command interval periods are required after refresh. Thus if in FIGS. 2 or 4 the ACTIVE/PRECHARGE commands of the modified refresh are shifted two intervals to the right, the PRECHARGE would then occur during the data access on bank 1 so that the ACTIVE/PRECHARGE sequence bridges over accesses on banks 0 and 1. However, there would still be two command intervals after this moved PRECHARGE position, so that refreshed bank 2 is (just) available for its advance Active command. Longer access sequences, whether of longer bursts or more bursts or both, give more flexibility to the location of the commands. The positions are preferably pre-selected as part of the set up, but can also be arbitrated to fit in with other commands Longer data access sequences also enable the commands to be completed on a bank that is the next scheduled for access if nine (for example) command intervals are available before the advance activation for data.

It will also be appreciated that if more than four banks were provided so that there were a longer time before access to the refreshed bank was required, this also allows more bridging opportunity, even if the sequence of command intervals to a given bank were fewer.

The implementation has been described with a row refresh every 3.9 μs (or such other time as may be appropriate for a different SDRAM). However, it is possible to use group refresh intervals, for example 16 row addresses to be refreshed in 62.5 μs. In this instance the secondary timer would require multiple latching so that if a given row of the group was not refreshed then it would know which row had failed and input to the multiplexer accordingly.

Group refresh intervals may conveniently be implemented when there are long access periods to a given bank. In this situation there may be time for several rows of another bank to be refreshed and it may synchronize better. The control sequences and secondary tinier intervention would be simpler when restricted to one bank within a refresh interval.

Another modification that may be utilised is to keep track of whether a row has been accessed for a data operation within its required refresh interval, and if so not perform the modified refresh as the data operation would have provided a refresh. This would require time and sequence controls, and a memory system to record refreshed rows the basic rule being that any given row has to be refreshed or data accessed within 64 ms (for the exemplified SDRAM) of its last refresh or data access.

What is claimed is:

1. A method of refreshing an SDRAM chip having a memory internally configured in a plurality of banks, the method comprising:

issuing data operation commands in burst mode whereby at least some command intervals are available for other operation commands;

issuing in one of said available command intervals a command to open a row in a bank other than the bank under access in the current burst;

after a predetermined interval and before said bank other than the bank under access is required for a data operation, issuing in another of said available command intervals a command to close the said bank.

2. The method of claim 1 in which the SDRAM has at least four banks and the bank other than the bank under access is also selected to be a bank other than the bank next scheduled for access.

3. The method of claim 1 in which the SDRAM has at least four banks and the bank other than the bank under access is also selected to be a bank other than the bank last under access.

4. The method of claim 1 in which available command intervals are used to open the next bank required for data access and the burst length is sufficient for additional command intervals to be available for the commands to open and close said row.

5. The method of claim 4 in which the commands to open and close the row are issued during the same burst.

6. The method of claim 1 in which data operation commands are issued in burst mode with a plurality of accesses to the same row so that there are sufficient available command intervals both to open the next bank required for data access and for the commands to open and close said row.

7. The method of claim 6 in which the commands to open and close the row are issued during said plurality of accesses.

8. The method of claim 1 in which a row in each bank is refreshed in sequence, the row and bank address being generated within a predetermined refresh interval.

9. The method of claim 1 in which a secondary timer monitors whether a refresh has occurred before the end of a refresh interval, and if it has not occurred overrides data access to ensure refresh.

10. Apparatus for generating commands for refreshing an SDRAM that is internally configured in a plurality of banks and operates in burst sequences, the apparatus comprising an address generator for establishing refresh addresses of row and bank due for refresh;

a multiplexer for sequencing the refresh addresses with data addresses so that the refresh address is sequenced to a bank that will not be accessed for a data burst;

a controller for inserting into burst command intervals an open command to the refresh address and after a predetermined minimum interval inserting into burst command intervals a close command to the refresh address, and in which the open and close operations are arranged to be completed before the bank of the refresh address is next addressed by a data access command.

11. Apparatus according to claim 10 in which the refresh address is sequenced to a bank other than the one that is scheduled to receive the next data burst.

12. Apparatus according to claim 10 in which the refresh address is sequenced to a bank other than the one that received the last data burst.

13. Apparatus according to claim 10 in which a secondary timer monitors for completion of the open and close command sequence and overrides the multiplexer sequence to prioritize a refresh address in the event of said command sequence not being completed to that refresh address a predetermined time before a maximum refresh interval.

14. Apparatus according to claim 10 in which the apparatus is within a controller for the SDRAM.

* * * * *